United States Patent
Miyazawa et al.

(10) Patent No.: US 6,307,228 B1
(45) Date of Patent: Oct. 23, 2001

(54) SEMICONDUCTOR DEVICE WITH PEROVSKITE CAPACITOR AND ITS MANUFACTURE METHOD

(75) Inventors: Hisashi Miyazawa; Kenichi Inoue; Tatsuya Yamazaki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/357,805

(22) Filed: Jul. 20, 1999

Related U.S. Application Data

(62) Division of application No. 09/040,284, filed on Mar. 18, 1998, now Pat. No. 5,953,619.

Foreign Application Priority Data

Aug. 6, 1997 (JP) .................................................. 9-212091

(51) Int. Cl.$^7$ .......................... H01L 27/108; H01L 29/94
(52) U.S. Cl. .......................... 257/310; 257/383; 257/371; 257/296
(58) Field of Search .................................... 257/310, 383, 257/382, 372, 371, 369, 306, 296, 758, 760

(56) References Cited

U.S. PATENT DOCUMENTS

| | | | |
|---|---|---|---|
| 5,350,705 | * 9/1994 | Brassington et al. | 257/295 |
| 5,442,585 | 8/1995 | Eguchie et al. | 365/149 |
| 5,604,696 | * 2/1997 | Takaishi | 365/149 |
| 5,689,126 | * 11/1997 | Takaishi | 257/306 |
| 5,739,563 | 4/1998 | Kawakubo et al. | 257/295 |
| 5,796,136 | * 8/1998 | Shinkawata | 257/306 |

FOREIGN PATENT DOCUMENTS

| | | |
|---|---|---|
| 05-013708 | 1/1993 | (JP) . |
| 06-132479 | 5/1994 | (JP) . |
| 08-023079 | 1/1996 | (JP) . |
| 08-316430 | 11/1996 | (JP) . |
| 09-199679 | 7/1997 | (JP) . |
| 11-017124 | 1/1999 | (JP) . |

\* cited by examiner

*Primary Examiner*—Steven Loke
*Assistant Examiner*—Douglas W. Owens
(74) *Attorney, Agent, or Firm*—Armstrong,Westerman, Hattori, McLeland & Naughton, LLP

(57) ABSTRACT

A method of manufacturing a semiconductor device which has the steps of: forming an insulated gate field effect transistor of a first conductivity type on a semiconductor substrate; forming a first insulating film over the semiconductor substrate, the first insulating film covering the insulated gate electrode; forming a contact window through the first insulating film to at least one of the source/drain regions; embedding a metal plug in the contact window; forming a second insulating film having an oxygen blocking function on the first insulating film, the second insulating film covering the metal plug; forming a capacitor lower electrode on the second insulating film; forming a dielectric oxide film having a perovskite crystal structure on the lower electrode; annealing the semiconductor substrate in an oxygen-containing atmosphere; and forming a capacitor upper electrode on the dielectric oxide film. A semiconductor device can be realized which has capacitors with dielectric oxide films of a perovskite crystal structure having a high dielectric constant.

20 Claims, 9 Drawing Sheets

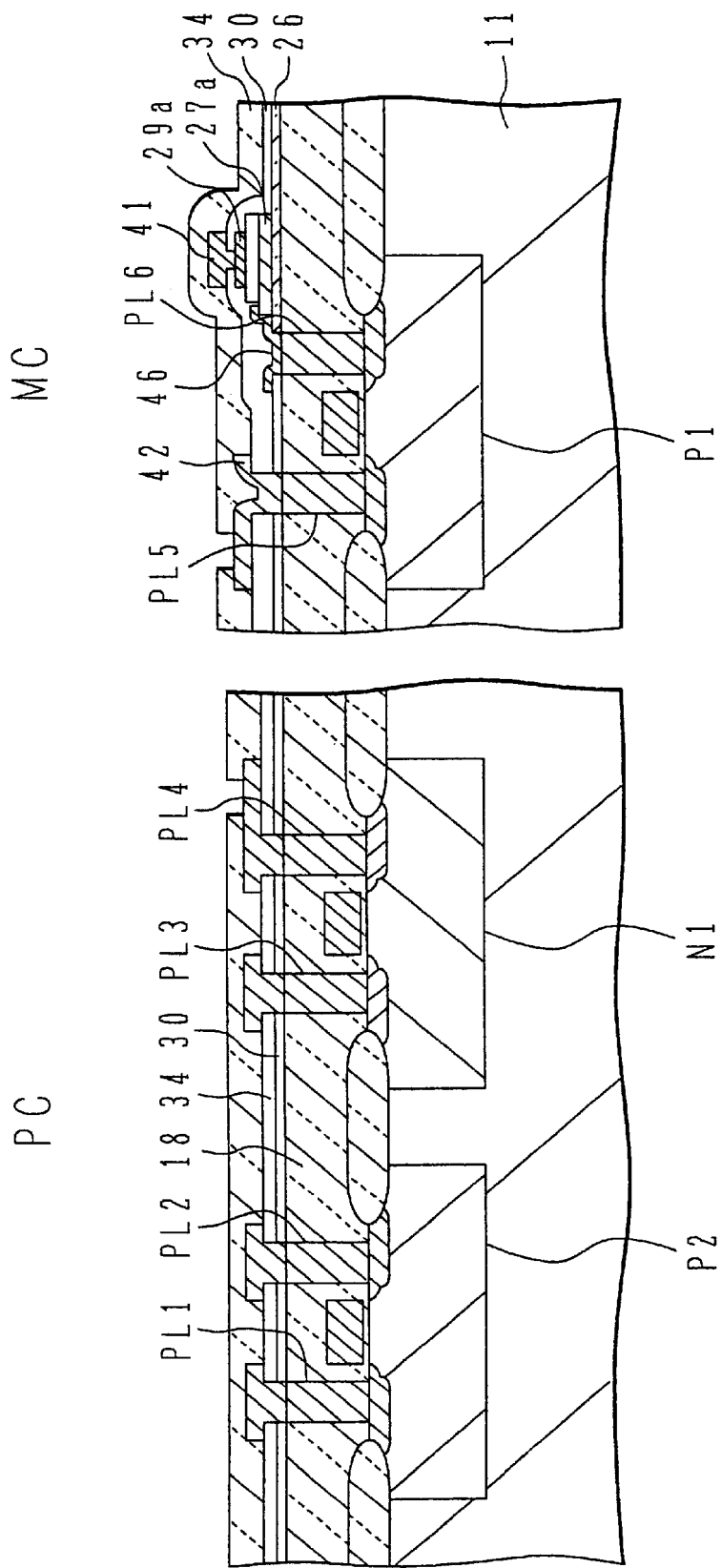

SEMICONDUCTOR DEVICE WITH PEROVSKITE CAPACITOR AND ITS MANUFACTURE METHOD

This application is a division of prior application Ser. No. 09/040,284 filed Mar. 18, 1998, now U.S. Pat. No. 5,953,619.

This application is based on a Japanese Patent Application No. 9-212091 filed on Aug. 6, 1997, the entire contents of which are incorporated herein by reference.

BACKGROUND OF THE INVENTION a) Field of the Invention

The present invention relates to a semiconductor device and its manufacture method, and more particularly to a semiconductor device with capacitors having dielectric oxide films of a perovskite crystal structure, and its manufacture method.

b) Description of the Related Art

One memory cell of a dynamic random access memory (DRAM) is made of one transistor and one capacitor. In order to give a sufficiently large capacitance with a small capacitor, it is preferable that a capacitor dielectric film has as high a dielectric constant as possible. If the dielectric film is made of ferroelectric substance, the polarizing state of the dielectric film can be memorized so that a non-volatile ferroelectric random access memory (FRAM) can be realized.

As high dielectric constant substance having a relative dielectric constant of 10 or higher, or more preferably 50 or higher, oxide having a perovskite crystal structure is known such as barium strontium titanate (BST) (BaSrTiO). As ferroelectric substance, oxides having a perovskite crystal structure are also known such as PZT (PbZrTiO) and SBT (SrBiTiO). A dielectric oxide film of a perovskite crystal structure can be formed by spin-on such as a sol-gel method, sputtering, chemical vapor deposition (CVD), and the like.

A dielectric oxide film of a perovskite crystal structure just after it is formed often takes an amorphous phase or an insufficient crystallinity, or has often insufficient oxygen compositions. In such cases, the dielectric oxide film just after the film formation cannot be used as a good dielectric oxide film unless it is processed further. It is necessary to anneal it in an oxidizing atmosphere.

Even if insufficient oxygen atoms are replenished and the film is recrystallized, the characteristics of dielectric oxide are often degraded if the film is thereafter exposed in a reducing atmosphere such as high temperature hydrogen. However, in the manufacture processes of a semiconductor device, many semiconductor films and insulating films are formed by using hydrogen containing gas. After a dielectric oxide film of a perovskite crystal structure is formed, if another film is formed using such hydrogen containing gas, the dielectric characteristics of the film may be degraded considerably.

SUMMARY OF THE INVENTION

It is an object of the present invention to provide a semiconductor device with capacitors having dielectric oxide films of a perovskite crystal structure providing a high dielectric constant.

It is another object of the present invention to provide a method of manufacturing a semiconductor device capable of forming a dielectric oxide film of a perovskite crystal structure providing a high dielectric constant and capable of fabricating semiconductor elements at a high integration density.

According to one aspect of the present invention, there is provided a semiconductor device comprising: a semiconductor substrate having a first conductivity type region and a second conductivity type region, the second conductivity type being opposite to the first conductivity type; first and second insulated gate field effect transistors respectively having first and second insulated gate electrode structures formed on the first and second conductivity type regions of the semiconductor substrate and first and second pairs of impurity doped regions of the second and first conductivity types formed in the semiconductor substrate on both sides of the first and second insulated gate electrode structures; a first insulating film formed over the semiconductor substrate and covering the first and second insulated gate field effect transistors; at least two metal plugs formed through the first insulating film and reaching at least ones of the first and second pairs of impurity doped regions of the first and second insulated gate field effect transistors; a second insulating film having an oxygen blocking function and covering the first insulating film; a lower electrode formed on the second insulating film; a dielectric oxide film having a perovskite crystal structure and formed on the lower electrode; an upper electrode formed on the dielectric oxide film to form a capacitor together with the lower electrode and the dielectric oxide film; a third insulating film formed over the semiconductor substrate and covering the capacitor; and a local interconnect extending on the third insulating film and being connected via a contact hole formed through the third insulating film between one of the metal plugs and said upper or lower electrode.

According to another aspect of the present invention, there is provided a method of manufacturing a semiconductor device comprising the steps of: forming an insulated gate field effect transistor on a semiconductor substrate, the insulated gate field effect transistor having an insulated gate electrode and source/drain regions of a first conductivity type; forming a first insulating film over the semiconductor substrate, the first insulating film covering the insulated gate electrode; forming a contact window through the first insulating film to at least one of the source/drain regions; embedding a metal plug in the contact window; forming a second insulating film having an oxygen blocking function on the first insulating film, the second insulating film covering the metal plug; forming a capacitor lower electrode on the second insulating film; forming a dielectric oxide film having a perovskite crystal structure on the lower electrode; annealing the semiconductor substrate in an oxygen-containing atmosphere after the step of forming the dielectric oxide film; and forming a capacitor upper electrode on the dielectric oxide film.

Using the metal plug facilitates to form a highly integrated semiconductor element. The second insulating film having an oxygen blocking function can prevent oxidation of the metal plug and can stably form a dielectric oxide film of a perovskite crystal structure.

As above, it is possible to use a metal plug and form a capacitor with a dielectric oxide film of a perovskite crystal structure having a high dielectric constant.

BRIEF DESCRIPTION OF THE DRAWINGS

FIGS. 16 to 18 are cross sectional views of semiconductor substrates showing the peripheral circuit areas and memory cell areas of semiconductor devices according to other embodiments of the invention.

DETAILED DESCRIPTION OF THE PREFERRED EMBODIMENTS

Embodiments of the invention will be described, referring to the accompanying drawings.

Figure 1:
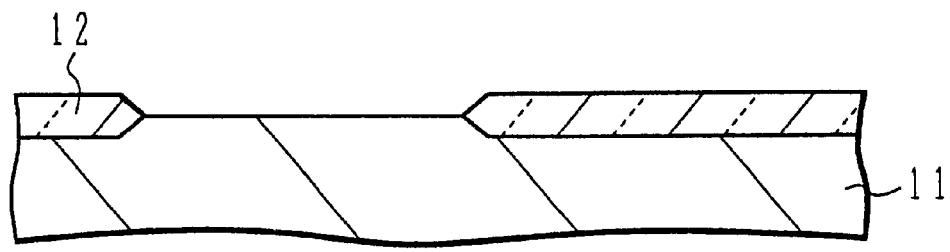
FIGS. 1 to 14 are cross sectional views of a semiconductor substrate illustrating a method of manufacturing a semiconductor device according to an embodiment of the invention.

As shown in FIG. 1, on the surface of a p-type silicon substrate 11, a field oxide film 12 is formed to a thickness of about 500 nm by local oxidation of silicon (LOCOS).

The silicon substrate 11 of p-type is illustratively shown, and n-type wells, p-type wells, p-type wells in n-type wells may be formed as desired in the surface layer of the silicon substrate 11. The conductivity types opposite to those shown in the embodiment may be used.

Figure 2:
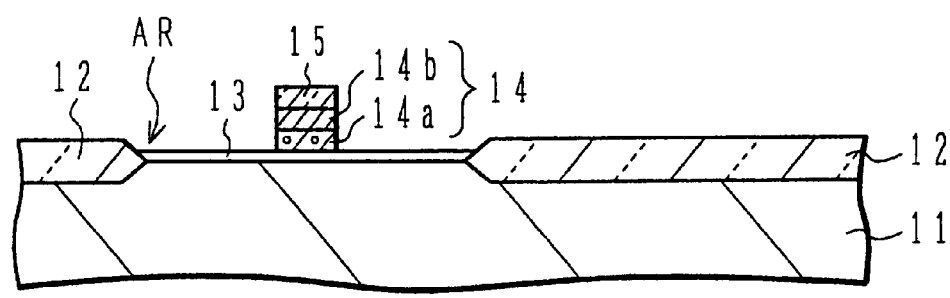

As shown in FIG. 2, on the surface (active region AR) of the silicon substrate defined by the field oxide film 12, a gate oxide film 13 of about 15 nm thick is formed by thermal oxidation. On this gate oxide film 13, a gate electrode layer 14 is formed which is a lamination of a polysilicon layer 14a of about 120 nm thick and a tungsten silicide (WSi) layer 14b of about 150 nm thick. The gate electrode layer may be formed by sputtering, CVD or the like. On this gate electrode layer 14, a silicon oxide film 15 is formed by CVD. A resist pattern is formed on the silicon oxide film to pattern the silicon oxide film 15 and gate electrode layer 14 into the same shape. The resist film is removed thereafter.

Figure 3:
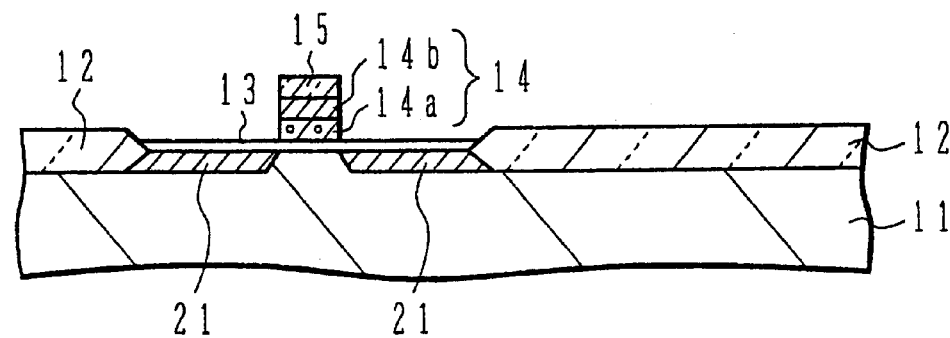

As shown in FIG. 3, by using the pattern of the gate electrode layer 14 and silicon oxide film 15 as a mask, n-type impurity ions are implanted into the surface layer of the silicon substrate 11 at a low impurity concentration to thereby form a low concentration n-type impurity doped region 21. If a CMOS circuit is to be formed on the silicon substrate, ions of opposite polarities are implanted separately into n-channel and p-channel transistor regions.

For example, P and/or As ions are implanted for n-channel transistors, and $BF_2$ ions are implanted for p-channel transistors. An acceleration voltage is, for example, about 50 to 60 keV, and a dose is about $10^{13}$ cm$^{-2}$.

Figure 4:
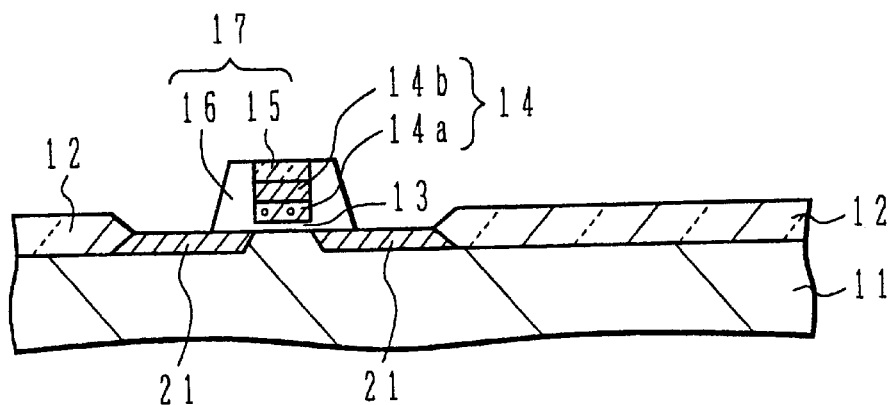

As shown in FIG. 4, a high temperature oxide (HTO) film is deposited to a thickness of about 150 nm at a substrate temperature of 800° C. over the whole surface of the silicon substrate, covering the gate electrode structure. Reactive ion etching (anisotropic etching) is thereafter performed to remove the HTO film on a flat surface and leave side spacers 16 on the side walls of the gate electrode structure. The silicon oxide film 15 formed on the upper surface of the gate electrode is left. The silicon oxide film 15 and side spacers 16 are collectively called a first insulating layer 17 hereinafter.

Figure 5:
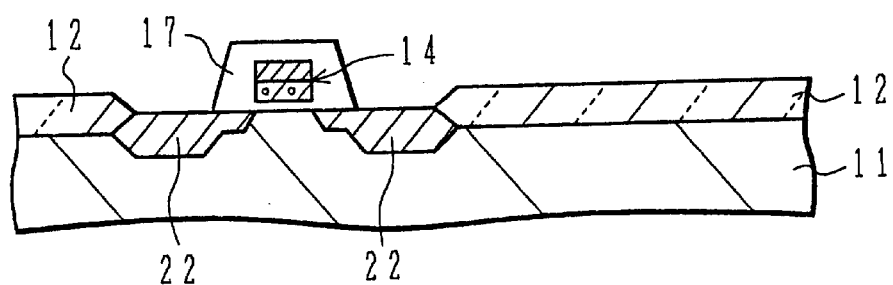

As shown in FIG. 5, by using the first insulating film 17 as a mask, ions are implanted at a high concentration to form source/drain regions 22 of a high impurity concentration. For example, As (arsenic) ions are implanted at a dose of about $10^{14}$ to $10^{15}$ cm$^{-2}$ for n-channel transistors, and $BF_2$ ions are implanted at a dose of about $10^{14}$ to $10^{15}$ cm$^{-2}$ for p-channel transistors.

Figure 6:
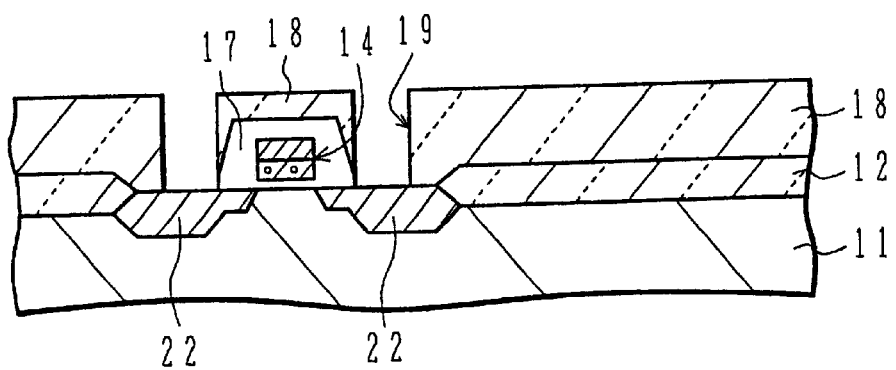

As shown in FIG. 6, an oxide film 18 such as borophosphosilicate glass (BPSG), oxynitride and silicon oxide is formed over the whole surface of the silicon substrate 11. After this oxide film 18 is formed, the surface thereof is planarized to make the film 18 have a thickness of about 1 μm.

The oxide film 18 may be a single layer or a lamination of a plurality of layers. For example, an oxynitride layer of about 200 nm thick is formed first, and a plasma-enhanced tetraetoxysilane (TEOS) oxide film is formed on the oxynitride layer. Planarizing the oxide film 18 may be done by reflowing, chemical mechanical polishing (CMP), etch-back or the like.

After the oxide film 18 is planarized, contact holes 19 exposing the source/drain regions of a MOS transistor are formed. For example, the contact hole 19 is formed through reactive ion etching by using a resist mask having an opening of about 0.5 μm diameter.

Figure 7:
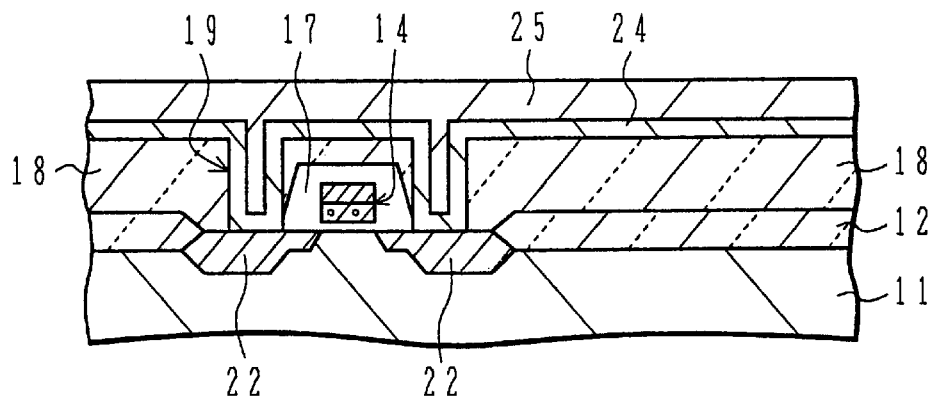

As shown in FIG. 7, a wiring layer is formed over the whole surface of the substrate 19 provided with the contact holes 19. For example, the wiring layer includes a glue metal layer 24 and a W layer 25 formed thereon. The glue metal layer 24 may be a lamination of a Ti layer of about 20 nm thick and a TiN layer of about 50 nm thick and may be formed by sputtering. The W layer is deposited to a thickness of about 800 nm by CVD using $WF_6$ and $H_2$. The contact hole 19 is filled with this wiring layer which is connected to the source/drain region 22.

Figure 8:
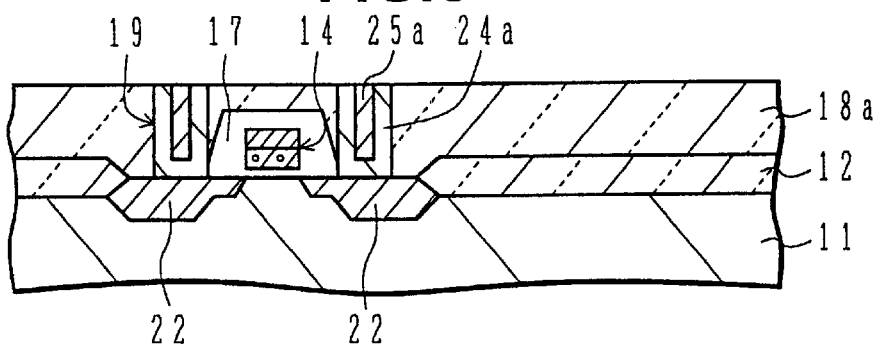

As shown in FIG. 8, the W layer 25 and glue metal layer 24 over the oxide film 18 are removed by etch-back. This etch-back may be dry etching using Cl containing gas. The W layer and glue metal layer over the oxide film 18 may be removed by CMP. With this etch-back or CMP, the surface of an oxide film 18a becomes generally flush with the surface of a metal plug made of a W layer 25a and a glue metal layer 24a. With the etch-back, the surface of the W layer 25a becomes lower than the nearby surface in some case.

Figure 9:
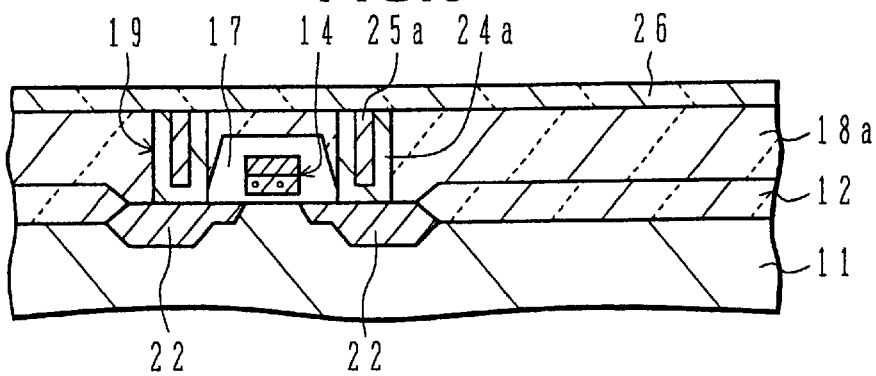

As shown in FIG. 9, on the planarized surface of the substrate, a nitride film 26 is deposited to a thickness of about 50 nm to 100 nm by plasma-enhanced CVD at a substrate temperature of about 350° C. The nitride film is formed at a low temperature in order to prevent oxidation of the W layer 25a and short-circuiting of a junction between the silicon substrate and the impurity diffused region to be caused by silicidization of the Ti layer.

It is preferable that after the nitride film is formed, an oxide film is formed on the nitride film to a thickness of about 80 nm. This oxide film may be a plasma-enhanced TEOS oxide film. The junction breakage is prevented by controlling the substrate temperature.

The nitride film covers the metal plug embedded in the contact hole, and prevents the metal plug from being oxidized by oxygen entering from the surface at a later process.

If the oxide film is formed on the nitride film, a contact with a capacitor lower electrode to be formed on the oxide film can be made more tight. Irrespective of whether the layer 26 is a single nitride film or a lamination of a nitride film and an oxide film, this layer 26 is called an oxygen shielding or blocking film hereinafter.

Figure 10:
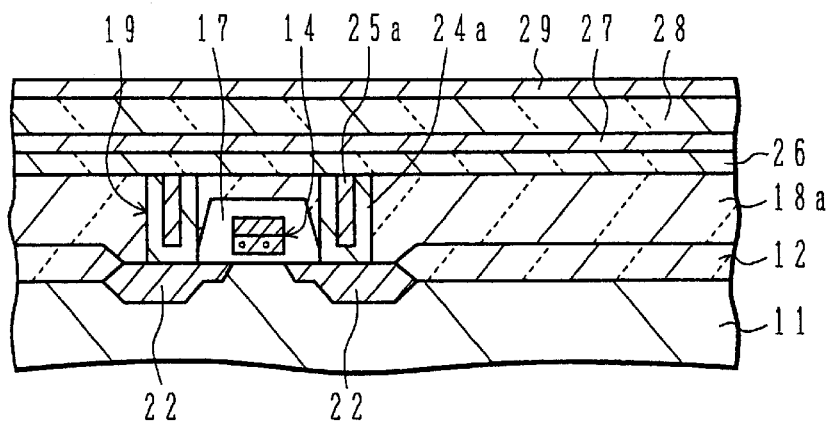

As shown in FIG. 10, a lower electrode layer 27, a PZT dielectric film 28 and an upper electrode layer 29 are formed on the oxygen shielding film 26 by sputtering. The lower electrode layer 27 may be a lamination of a Ti layer of 20 to 30 nm thick and a Pt layer of 150 nm thick, the PZT dielectric film 28 is 300 nm thick, and the upper electrode layer 29 is a Pt layer of 150 nm thick. The PZT dielectric film 28 has an amorphous phase without the polarizing characteristics, unless any process is performed after the deposition.

After the PZT dielectric film 28 is deposited and before or after the upper electrode layer 29 is deposited, an annealing process in an $O_2$ atmosphere is performed. For example, the annealing process is performed for about 5 seconds at 850° C. in an $O_2$ atmosphere at one atm. Such an annealing process can be performed by using a rapid thermal anneal (RTA) system. Instead of RTA, an annealing process may be performed by using a resistance heating furnace at 800° C. or higher for 10 minutes or longer, for example, at 800° C. for 30 minutes.

This annealing process in an $O_2$ atmosphere polycrystallizes the PZT dielectric film 28 and gives a polarization factor of, for example, about 30 $\mu C/cm^2$. In this case, the W layer 25a is not oxidized because it is covered with the oxygen shielding or blocking film 26. If the W layer 25a is oxidized, volume expansion thereof may break the lamination structure. For example, volume expansion by 1 $\mu m$ in the height direction may occur.

Figure 11:
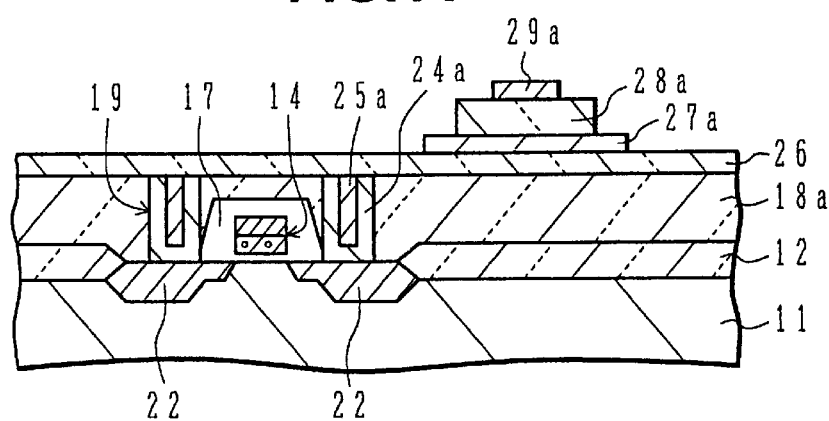

As shown in FIG. 11, the upper electrode 29, PZT dielectric film 28 and lower electrode 27 are patterned by using known photolithography techniques. This patterning forms a lower electrode 27a, a PZT dielectric film 28a and an upper electrode 29a. It is preferable to gradually reduce the areas of the three layers from the bottom layer to the top layer in order to make gentle steps. After the capacitor is patterned, a recovery anneal process is further performed at a temperature of 500 to 650° C. in an oxygen atmosphere.

The PZT dielectric film 28A shows excellent polarizing characteristics if it has (1 1 1) orientation when formed on the lower electrode. In order to establish such a crystal orientation, it is preferable to control the thickness of the lower electrode 27a and set x to 1 to 1.4 or more preferable to about 1.1, where x is a Pb composition in the PZT dielectric film 28a made of $Pb_xZr_yTi_{1-}$.

Figure 12:
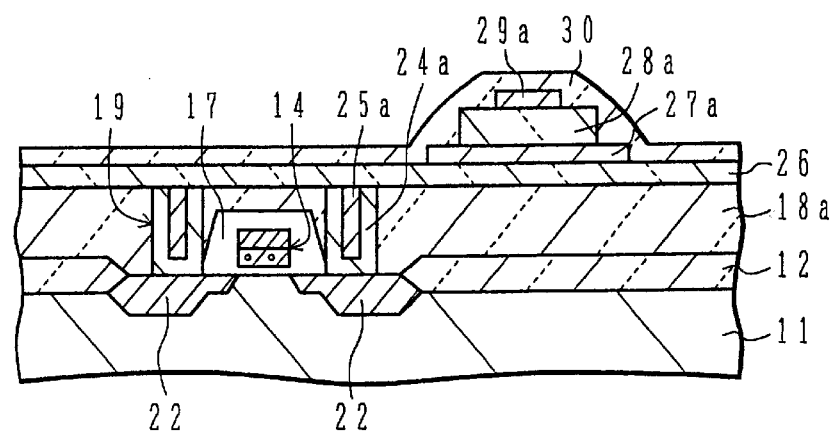

As shown in FIG. 12, a plasma-enhanced TEOS oxide film is deposited at a temperature of about 390 to 400° C. over the whole substrate surface, covering the capacitor. After the PZT dielectric film is formed, a high temperature process with reducing gas such as hydrogen is preferably avoided.

Figure 13:
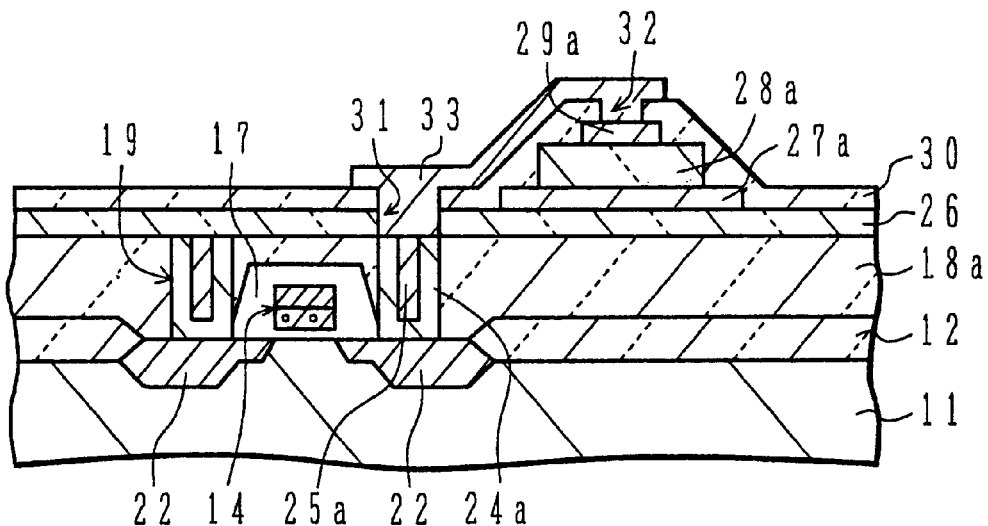

As shown in FIG. 13, an opening 31 is formed through the oxide film 30 and oxygen shielding film 26 down to the metal plug. An opening 32 is also formed through the oxide film 30 down to the upper electrode 29a.

A TiN layer is deposited over the whole substrate surface and patterned to form a local interconnect 33 connecting the capacitor upper electrode 29a to the metal plug. For example, the TiN layer 33 is deposited to a thickness of about 100 nm by reactive sputtering.

Figure 14:
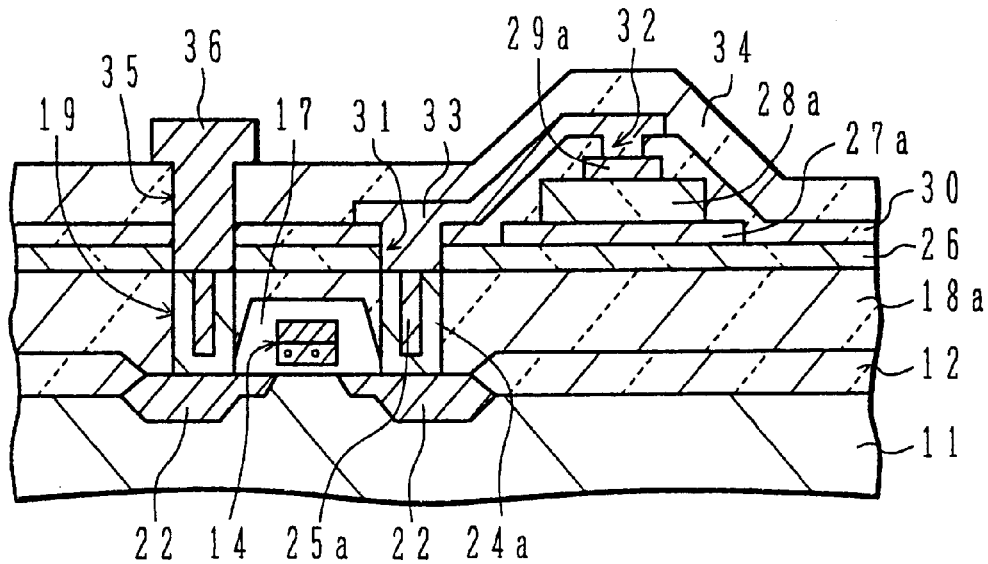

As shown in FIG. 14, an oxide film 34 is formed on the whole substrate surface, covering the local interconnect 33. An opening 35 is formed through the oxide film 34 and underlying insulating film down to the other metal plug, and a wiring pattern 36 of Al or the like is formed.

If necessary, other insulating layers and higher level wiring layers are formed. In this manner, a semiconductor device is completed which has capacitors with dielectric films of a perovskite crystal structure.

The manufacture processes have been described above by taking a memory cell area as an example. At the same time when the memory cell manufacture processes are performed, transistors and the like in the peripheral circuit area are formed.

Figure 15:
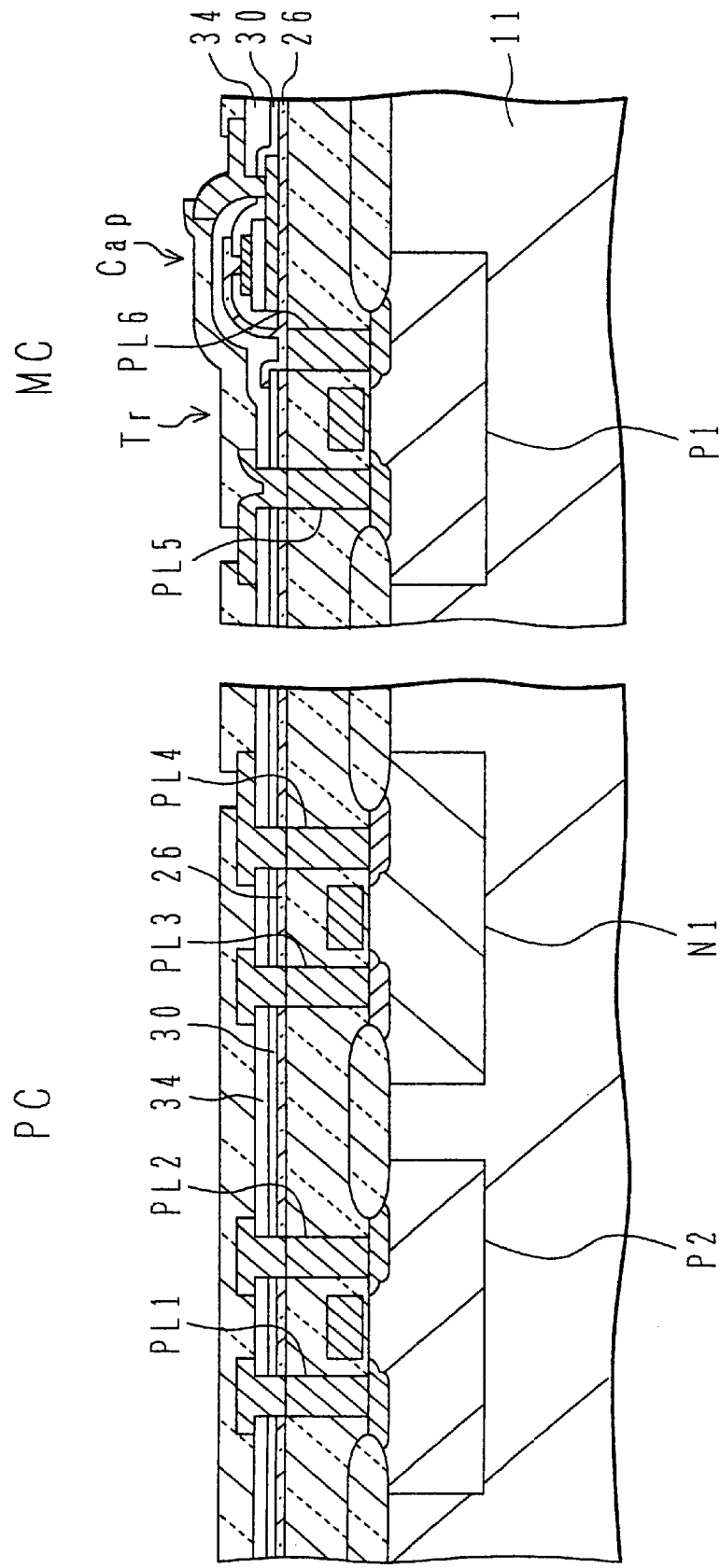
FIG. 15 is a cross sectional view of a semiconductor substrate showing both the peripheral circuit area and the memory cell area of the semiconductor device of the embodiment shown in FIGS. 1 to 14.

FIG. 15 is a cross sectional view showing both a peripheral circuit area PC and a memory cell area MC. In the memory cell area MC, a MOS transistor Tr and its capacitor Cap described with the above embodiment are formed in a p-type well P1 of the silicon substrate. In the peripheral circuit area PC, an n-channel MOS transistor is formed in a p-type well P2 and a p-channel MOS transistor is formed in an n-type well N1.

The oxide shielding film 26 is formed also in the peripheral circuit area, and is selectively removed only at the regions where metal plugs PL1 to PL4 are formed. The plugs PL1 and PL2 form contact with the n-type regions of the n-channel transistors, and the plugs PL3 and PL4 form contacts with the p-type regions of the p-channel transistor. Contacts with the source/drain regions of CMOS transistors have the same metal plug structure.

Figure 16:
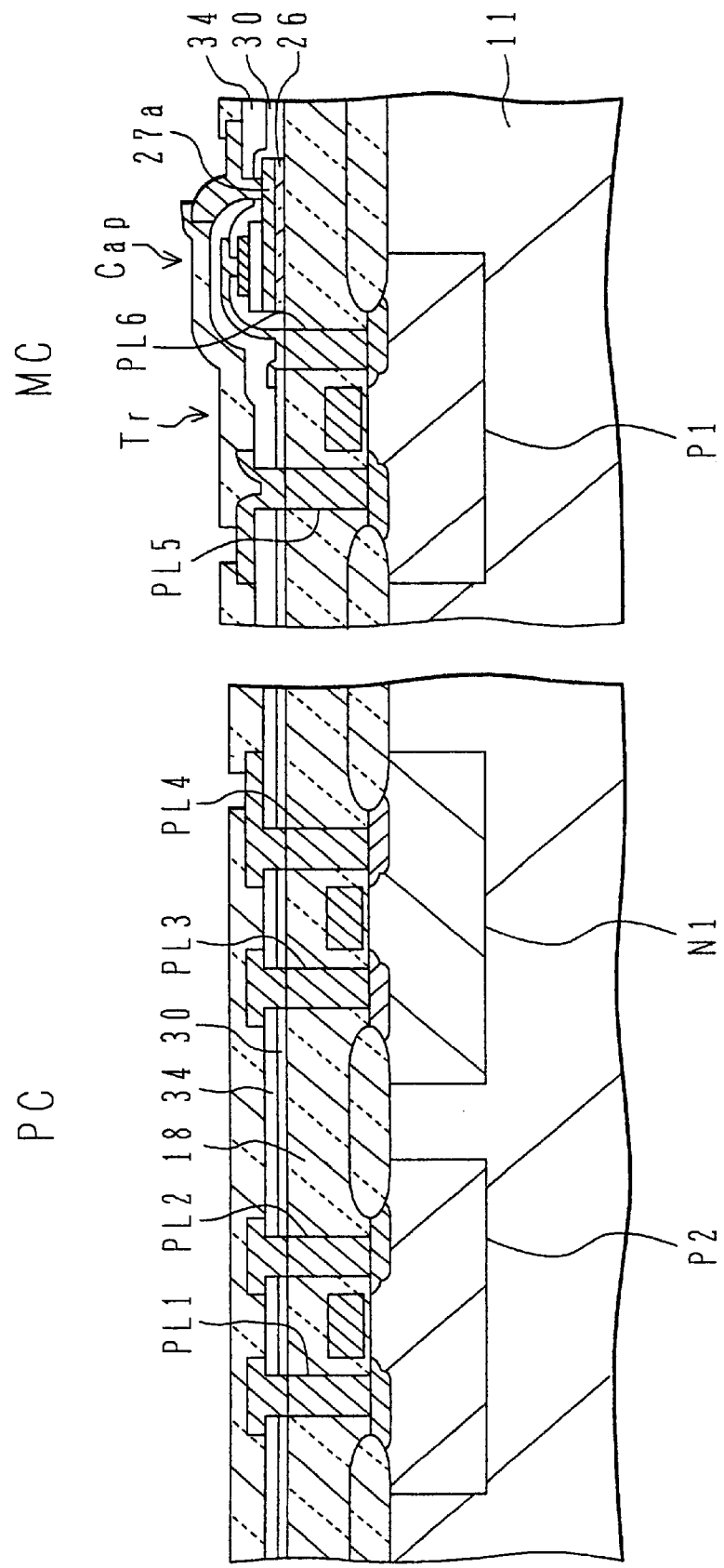

FIG. 16 shows the structure of a semiconductor device in which after the capacitor structure is formed by the process shown in FIG. 11, the exposed oxygen blocking film 26 is removed. In the peripheral circuit area PC, the oxygen blocking film 26 is completely removed and the oxide films 30 and 34 are stacked directly upon the oxide film 18. In the memory cell area MC, the oxygen blocking insulating film 26 is left only under the capacitor lower electrode 27a, and removed in the other area of the memory cell area MC. Removing the oxygen shielding or blocking film may be performed by control etching.

Figure 17:
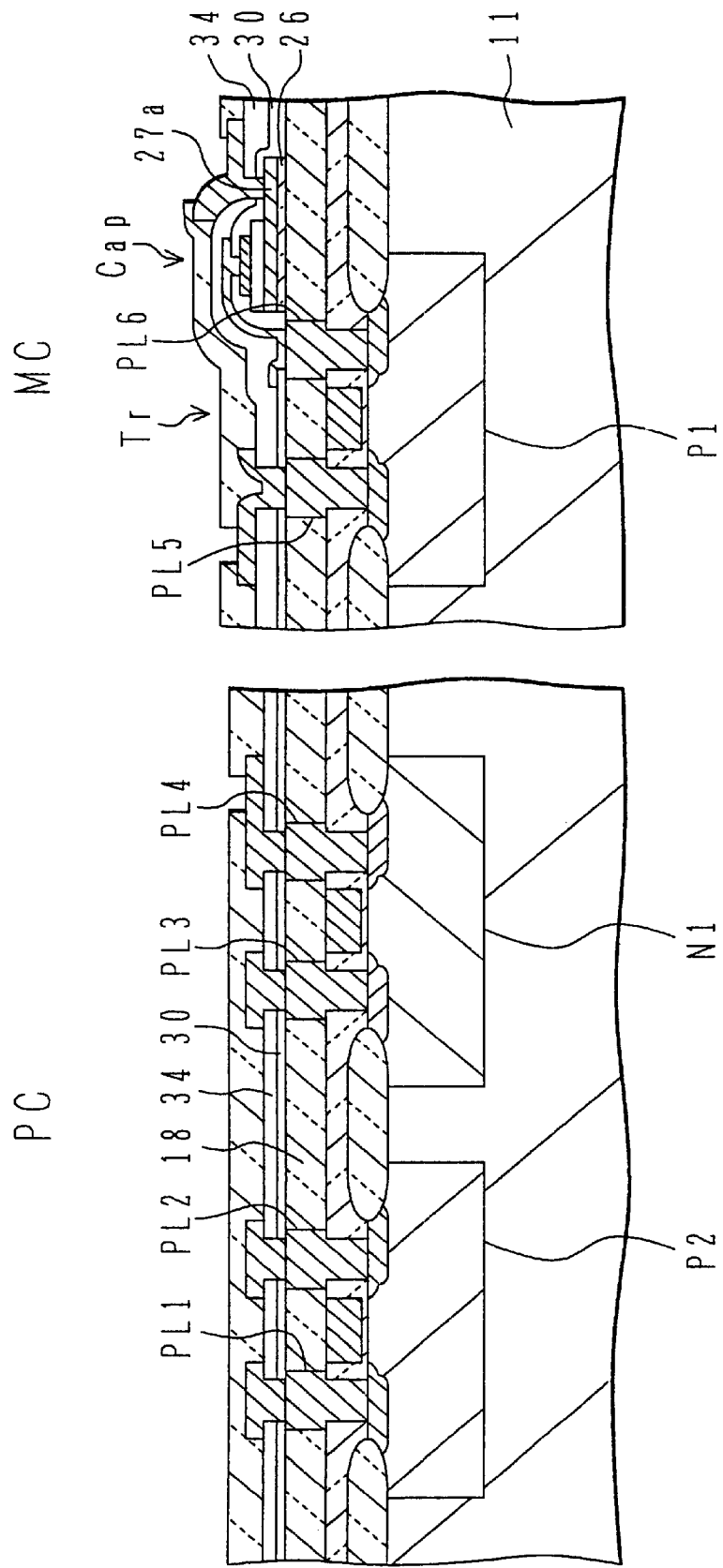

FIG. 17 shows the structure of a semiconductor device in which the oxide film 18 has a lamination structure of a lower oxynitride film and an upper oxide film. Before the metal plug is formed, the oxide film in the contact window is lightly wet-etched by HF etchant. Each contact window has therefore a two-step structure with a smaller diameter at the lower portion and a larger diameter at the upper portion. By broadening the upper portion, contact of the metal plug can be improved.

FIG. 18 shows another structure. The structures described above have the capacitor upper electrode connected to the nearest source/drain region by the local interconnect. In the structure shown in FIG. 18, the capacitor upper electrode is connected to another area via a wiring pattern 41.

The capacitor lower electrode 27a is exposed at its one end portion and connected via a local interconnect 46 to a metal plug PL6 and to the nearest source/drain region.

It is apparent that other various structures may be made by those skilled in the art. It is preferable that after the capacitor dielectric film is formed, recovery annealing is performed at a desired timing to prevent deterioration of the polarizing characteristics of the dielectric oxide film.

The present invention has been described in connection with the preferred embodiments. The invention is not limited only to the above embodiments. It will be apparent for those skilled in the art that various modifications, improvements, combinations, and the like can be made.

What is claimed is:

1. A semiconductor device comprising:
a semiconductor substrate having a first conductivity type region and a second conductivity type region, the second conductivity type being opposite to the first conductivity type;
first and second insulated gate field effect transistors respectively having first and second insulated gate electrode structures formed in the first and second conductivity type regions of said semiconductor substrate and first and second pairs of impurity doped regions of the second and first conductivity types formed in said semiconductor substrate on both sides of said first and second insulated gate electrode structures;
a first insulating film formed over said semiconductor substrate and covering said first and second insulated gate field effect transistors;

at least two metal plugs formed through said first insulating film, having an upper surface exposed at an upper surface of the first insulating film and reaching at least one of the first and second pairs of impurity doped regions of said first and second insulated gate field effect transistors;

a second insulating film having an oxygen blocking function and covering said first insulating film;

a lower electrode formed on said second insulating film;

a dielectric oxide film having a perovskite crystal structure and formed on said lower electrode;

an upper electrode formed on said dielectric oxide film to form a capacitor together with said lower electrode and said dielectric oxide film;

a third insulating film formed over said semiconductor substrate and covering the capacitor; and a local interconnect extending on said third insulating film and being connected via contact holes formed through said third insulating film between one of said metal plugs and said upper or lower electrode.

2. A semiconductor device according to claim 1, wherein said dielectric oxide film comprises one of PZT, SBT, and BST.

3. A semiconductor device according to claim 1, wherein said second insulating film is a nitride film.

4. A semiconductor device according to claim 1, wherein said metal plug comprises refractory metal.

5. A semiconductor device according to claim 1, wherein said second insulating film is selectively formed on said first insulating film.

6. A semiconductor device comprising:

an insulated gate field effect transistor having an insulated gate electrode structure formed in a semiconductor substrate and a pair of impurity doped regions formed in said semiconductor substrate on both sides of said insulated gate electrode structure;

a first insulating film formed over said semiconductor substrate and covering said insulated gate field effect transistor;

at least one metal plug formed through said first insulating film having an upper surface exposed at an upper surface of the first insulating film and reaching at least one of a pair of impurity doped regions of said insulated gate field effect transistor;

a second insulating film having an oxygen blocking function and covering said first insulating film;

a lower electrode formed on said second insulating film;

a dielectric oxide film having a perovskite crystal structure and formed on said lower electrode;

an upper electrode formed on said dielectric oxide film to form a capacitor together with said lower electrode and said dielectric oxide film;

a third insulating film formed over said semiconductor substrate and covering the capacitor; and a local interconnect extending on said third insulating film and being connected via contact holes formed through said third insulating film between one of said at least one metal plug and said upper or lower electrode.

7. A semiconductor device according to claim 6, wherein the upper surface of said first insulating film is generally flush with the upper surface of said metal plug.

8. A semiconductor device according to claim 6, wherein said dielectric oxide film comprises one of PZT, SBT, and BST.

9. A semiconductor device according to claim 6, wherein said second insulating film is a nitride film.

10. A semiconductor device according to claim 6, wherein said metal plug comprises refractory metal.

11. A semiconductor device according to claim 6, wherein said second insulating film is selectively formed on said first insulating film.

12. A semiconductor device according to claim 6, wherein said second insulating film is a multi-layer of a nitride film and an oxide film.

13. A semiconductor device comprising:

an insulated gate field effect transistor having an insulated gate electrode structure formed in a semiconductor substrate and a pair of impurity doped regions formed in said semiconductor substrate on both sides of said insulated gate electrode structure;

a first insulating film formed over said semiconductor substrate and covering said insulated gate field effect transistor;

a contact hole formed through said first insulating film, reaching at least one of said pair of impurity doped regions of said insulated gate field effect transistor;

a metal plug embedded in said contact hole and shaped by etch back or chemical mechanical polishing, the metal plug having an upper surface exposed at an upper surface of said first insulating film;

a second insulating film having an oxygen blocking function and covering said first insulating film;

a lower electrode formed on said second insulating film;

a dielectric oxide film having a perovskite crystal structure and formed on said lower electrode;

an upper electrode formed on said dielectric oxide film to form a capacitor together with said lower electrode and said dielectric oxide film;

a third insulating film formed over said semiconductor substrate and covering the capacitor; and a local interconnect extending on said third insulating film and being connected via contact holes formed through said third insulating film between said metal plug and said upper or lower electrode.

14. A semiconductor device according to claim 13, wherein said dielectric oxide film comprises one of PZT, SBT, and BST.

15. A semiconductor device according to claim 13, wherein said second insulating film is a nitride film.

16. A semiconductor device according to claim 13, wherein said metal plug comprises refractory metal.

17. A semiconductor device according to claim 13, wherein said second insulating film is selectively formed on said first insulating film.

18. A semiconductor device according to claim 13, wherein said second insulating film is a multi-layer of a nitride film and an oxide film.

19. A semiconductor device comprising:

a semiconductor substrate having a memory cell region and a peripheral circuit region;

a first insulated gate field effect transistor having a first insulating gate electrode structure and a pair of impurity doped regions formed in said semiconductor substrate on both sides of said first insulated gate electrode structures formed in said memory cell region;

a second insulated gate field effect transistor having a second insulating gate electrode structure and a pair of impurity doped regions formed in said semiconductor substrate on both sides of said second insulated gate electrode structures formed in said peripheral circuit region;

a first insulating film formed over said semiconductor substrate and covering said first and second insulated gate field effect transistors;

at least two metal plugs formed through said first insulating film and reaching at least respective one of the first and second pairs of impurity doped regions of said first and second insulated gate field effect transistors, the metal plugs each having an upper surface exposed at an upper surface of said first insulating film;

a second insulating film having an oxygen blocking function and covering said first insulating film;

a lower electrode formed on said second insulating film;

a dielectric oxide film having a perovskite crystal structure and formed on said lower electrode;

an upper electrode formed on said dielectric oxide film to form a capacitor together with said lower electrode and said dielectric oxide film;

a third insulating film formed over said semiconductor substrate and covering the capacitor; and a local interconnect extending on said third insulating film and being connected via contact holes formed through said third insulating film between one of said metal plugs and said upper or lower electrode.

20. A semiconductor device according to claim 19, wherein said dielectric oxide film comprises one of PZT, SBT, and BST.

* * * * *